United States Patent [19]

Iwamatsu

[11] Patent Number: 4,910,515
[45] Date of Patent: Mar. 20, 1990

[54] DIGITAL SIGNAL PROCESSING CIRCUIT

[75] Inventor: Masayuki Iwamatsu, Hamamatsu, Japan

[73] Assignee: Yamaha Corporation, Hamamatsu, Japan

[21] Appl. No.: 157,700

[22] Filed: Feb. 19, 1988

[30] Foreign Application Priority Data

Feb. 25, 1987 [JP] Japan .................................. 62-41726

[51] Int. Cl.$^4$ .............................................. H03M 1/18
[52] U.S. Cl. ...................................... 341/110; 341/139
[58] Field of Search ................ 341/126, 138, 139, 143, 341/144, 145, 155, 156, 110; 381/71, 94

[56] References Cited

U.S. PATENT DOCUMENTS 3,999,129 12/1976 Kasson ............................. 341/110 X
4,349,913 9/1982 Skoog .................................... 341/139

Primary Examiner—William M. Shoop, Jr.
Assistant Examiner—Brian K. Young
Attorney, Agent, or Firm—Spensley Horn Jubas and Lubitz

[57] ABSTRACT

A digital signal processing circuit for processing input analog signals such as audio signals and video signals in the form of digital signals comprises an analog-to-digital converter for converting an input analog signal to a digital signal, a digital signal processing section for subjecting an output digital signal of the analog-to-digital converter to a digital signal processing including a processing for digitally amplifying the signal, a digital-to-analog converter for converting an output signal of the digital processing section to an analog signal, and an attenuator provided on the input side of the digital signal processing section for attenuating the digital signal provided by the analog-to-digital converter to a value which is below a value at which the digital signal processing section overflows. When the digital signal processing section has a gain, the level of the output of the analog-to-digital converter is attenuated to a value at which the digital signal processing section will not overflow so that occurrence of clipping distortion in the output waveform can be prevented.

4 Claims, 3 Drawing Sheets

DIGITAL SIGNAL PROCESSING CIRCUIT

BACKGROUND OF THE INVENTION

This invention relates to a digital signal processing circuit for processing analog signals such as audio signals and video signals in the form of digital signals and, more particularly, to a digital signal processing circuit capable of preventing clipping distortion from occurring in an output of the circuit when the circuit has a gain.

A signal system for digitally processing analog signals such as audio signals or video signals is generally constructed as shown in FIG. 2. In the signal system, an analog signal to be processed digitally is first converted to a digital signal by an analog-to-digital converter 10 and thereafter is processed as a digital signal by a digital signal processing section 12. The signal which has thus been processed as a digital signal is subsequently restored to an analog signal by a digital-to-analog converter 14 and delivered out of the system. The analog-to-digital converter 10 is disposed on the side of a playback device when an analog reproduced output such as one from an analog record is to be processed whereas it is disposed on the side of a recording device when a digital reproduced output such as one from a Compact Disc is to be processed (i.e., the reproduced output is applied directly to the digital signal processing section 12).

The digital signal processing section 12 is constructed specifically as a digital filter, digital graphic equalizer, digital effector or digital reverberator or the like digital device. These digital devices generally have a gain in themselves. Hence, overflow tends to occur in the process of signal processing when an input of a large level has been applied to the device with resulting occurrence of clipping distortion in an output waveform.

Assume, for example, that the digital signal processing section 12 is constructed of a digital graphic equalizer having amount of boost of +6 dB in a case where the analog-to-digital converter 10 and digital signal processing section 12 both consist of 16 bits and the level of an analog input is so adjusted that the conversion output of the analog-to-digital converter becomes data of full bits (i.e., value immediately before overflowing) with respect to an analog input of 0 dB (maximum reference level). In this case, if the graphic equalizer is boosted during application of an analog input signal of 0 dB, this graphic equalizer 12 naturally overflows with a result that clipping occurs in the output waveform. Accordingly, for providing a head margin in the digital signal processing section 12, the maximum acceptable input of the analog-to-digital converter 10 during boost has to be reduced to −6 dB.

As described above, in the system in which boost is carried out, the level of analog input must be reduced by the amount of boost before the analog input is applied to the analog-to-digital converter 10.

If the accuracy of the analog-to-digital converter 10 is satisfactory, the reduction in the level of the analog input will result only in increase in quantizing error. According to measurement conducted by the inventor of this invention, however, currently available analog-to-digital converters for consumer uses have a rather inferior linearity and actually measured accuracy of conversion of these converters are much worse than was expected. In an analog-to-digital converter of 16 bits, for example, it has been found that the accuracy of conversion is only in the order of 14 bits and the less significan 2 bits are reduced to a conversion error. For this reason, the greater the extent of reduction of the level of analog input, the worse is the condition under which the analog-to-digital converter 10 is used and so is signal-to-noise-ratio.

Besides, if the above described method of reducing the level of anlog input is to be applied to a case where a digital output such as one of a Compact Disc is applied directly to the digital signal processing section 12, an analog input to be recorded in the Compact Disc must also be reduced. This will necessitate alteration in the process of manufacturing of the Compact Disc and hence is not practicable.

It is, therefore, an object of the present invention to provide a digital signal processing circuit which has eliminated the above described disadvantages of the prior art circuits. More specifically, it is an object of the invention to provide a digital signal processing circuit capable of preventing overflow in digital signal processing without reducing the level of an analog input in a digital signal processing section having a gain whereby the adverse influence of conversion error in the analog-to-digital conversion is reduced and deterioration in the signal-to-noise ratio is prevented.

SUMMARY OF THE INVENTION

For achieving the above described object, it is a feature of the invention to attenuate, in a case where digital signal processing means in a digital signal processing circuit has a gain, the level of output of analog-to-digital conversion means is attenuated digitally to a value at which the digital signal processing means will not overflow.

The digital signal processing circuit according to the invention is characterized in that it comprises analog-to-digital conversion means for converting an input analog signal to a digital signal, digital signal processing means for subjecting an output digital signal of the analog-to-digital conversion means to a digital signal processing including at least a processing for digitally amplifying the signal, digital-to-analog conversion means for converting an output signal of the digital signal processing means to an analog signal, and digital signal attenuation means provided on the input side of the digital signal processing means for attenuating the digital signal provided by the analog-to-digital conversion means to a value which is below a value at which the digital signal processing means overflows.

According to the invention, a digital signal is applied to the digital signal processing means after being attenuated so that a head margin is provided in the digital signal to be processed in the digital signal processing means whereby overflow in the digital signal processing means and resulting occurrence of clipping distortion in the output waveform can be effectively prevented. Besides, since the attenuation of the signal is made after analog-to-digital conversion, the analog-to-digital conversion can be performed by using a signal before the attenuation which can be advantageously used to high orde bits and, accordingly, the adverse influence of deterioration of the conversion accuracy in low order bits due to the conversion error and deterioration in the signal-to-noise ratio can be prevented without lowering the quality of the signal. Further, according to the invention, a digital output such as one of a Compact Disc can be treated.

The attenuation of an output of analog-to-digital conversion means in a digital manner in the circuit of this invention can be realized by, e.g., bit shift down (attenuation of −6 dB can be obtained by one bit shift down) or multiplication with attenuation coefficient. The bit shift down is the simplest method because it can be realized by simply discarding low order bits.

According to the invention, the signal-to-noise ratio is not deteriorated for the reason stated below even when a signal after analog-to-digital conversion is attenuated.

It has heretofore been conceived that, in an analog-to-digital converter of e.g., 16 bits, all data of 16 bits of the output of the converter can be effectively used. It has therefore been considered that attenuation of the output of 16 bits after analog-to-digital conversion by unconditional discarding of several low order bits would definitely result in loss of information contained in a source signal (i.e., deterioration in the quality of the source signal) and for this reason such attenuation has never been carried out in the art. In other words, it has been taken for granted in designing of a digital signal processing circuit to exclude the method of digitally attenuating an output of analog-to-digital conversion for subsequent digital signal processing.

The above concept has however been reversed by the inventor of this invention who has conducted an experiment to determine whether all of 16 bits in the output of the 16-bit analog-to-digital converter are really effective or not.

The result of measurement has proved that although, as described above, the currently available 16-bit analog-to-digital converters for consumer uses are adapted for conversion of 16 bits, none of these converters actually has conversion accuracy of 16 bits but accuracy derived from several low order bits is deteriorated by non-linearity and noise inherent in the analog-to-digital converters so that these low order bits are not effective as proper data.

The same is the case with a 16-bit signal on the supply source side such as a Compact Disc. The amount of noise of low order bits is larger than the amount represented for these low order bits. This corresponds to the fact that analog-to-digital converters have not actually realized the accuracy of 16 bits.

Thus, aside from an expensive, high-grade analog-to-digital converter in which precision trimming is applied bit by bit, general consumer type analog-to-digital converters have failed to maintain sufficient accuracy in several rightmost bits.

If accuracy of analog-to-digital converters is adequately high, quantizing error will be substantially the same whether the level of a signal is attenuated before analog-to-digital conversion or after it. If, on the contrary, accuracy of analog-to-digital converters is low (i.e., conversion error is large), attenuation before analog-to-digital conversion will cause reduction in the level of the analog-to-digital conversion output and addition of conversion error in low order bits becomes dominant, resulting in ultimate deterioration in the signal-to-noise ratio.

If, however, attenuation is made after analog-to-digital conversion, the level of tee analog-to-digital conversion output will not change and, besides, conversion error in lw order bits is included in the attenuating portion of the signal after the analog-to-digital conversion so that there is no deterioration in the signal-to-noise ratio.

Even if the analog-to-digital conversion output is attenuated in such a manner that rightmost bits are discarded unconditionally, this is only discarding of a data portion containing noise so that deterioration in the quality of the signal will not take place.

BRIEF DESCRIPTION OF THE DRAWINGS

In the accompanying drawings.

DESCRIPTION OF PREFERRED EMBODIMENTS

Figures 1, 2, 3:
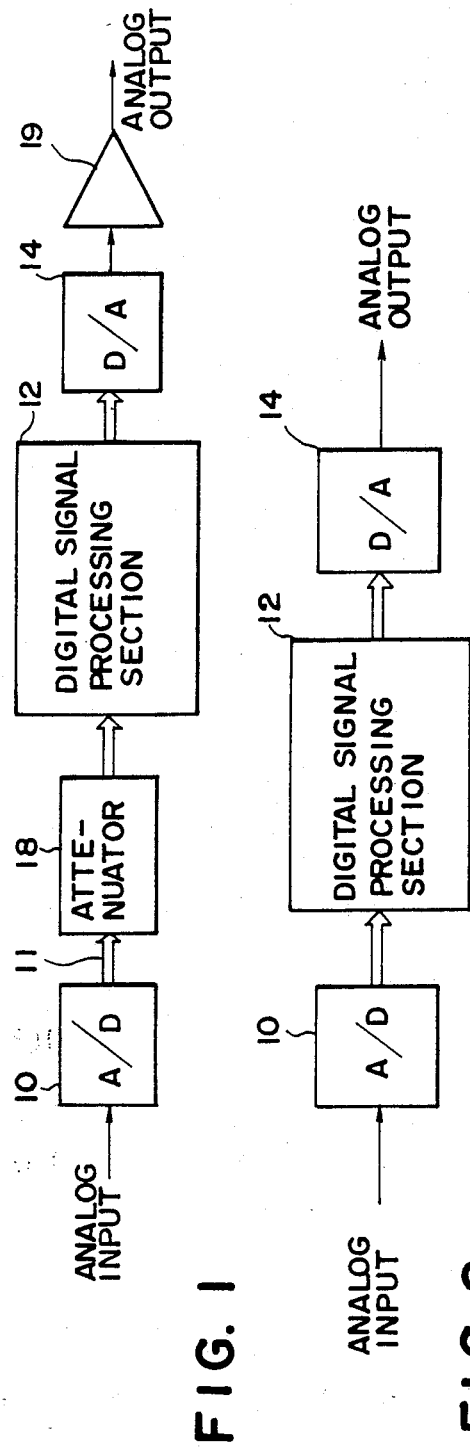
FIG. 1 is a block diagram showing an embodiment of the digital signal processing circuit according to the invention.
FIG. 2 is a block diagram showing a prior art digital signal processing circuit.
FIG. 3 is a circuit diagram showing a specific example of the embodiment of FIG. 1.

A preferred embodiment of the invention is shown in FIG. 1. An analog input signal to be processed is converted to a digital signal by an analog-to-digital converter 10 which constitutes analog-to-digital conversion means. This digital signal is applied to an attenuator 18 which constitutes digital signal attenuation means through a signal line 11. In the attenuator 18, the digital signal is attenuated by a predetermined amount in a digital manner.

The attenuated digital signal then is subjected to a predetermined digital signal processing by a digital signal processing section 12 which constitutes digital signal processing means and thereafter is converter to an analog signal by a digital-to-analog converter 14 which constitutes digital-to-analog conversion means. This analog signal is delivered out through an amplifier 19 which constitutes analog amplifying means.

The analog-to-digital converter 10 is disposed on the side of a playback device when an analog reproduced output such as one from an analog record is processed whereas it is disposed on the side of a recording device when a digital reproduced output such as one from a Compact Disc is directly processed (i.e., the reproduced output is applied directly to the attenuator 18).

The digital signal processing section 12 provides the input digital signal with a digital signal processing including at least amplifying the input digital signal in a digital manner. The digital signal processing section 12 is constructed as one of digital devices including, e.g., a digital filter, digital graphic equalizer, digital effector and digital reverberator.

The attenuator 18 is provided for digitally attenuating the input digital signal to the signal processing section 12 to a value which will not overflow in the amplification processing in the digital signal processing section 12. The amount of attenuation can be varied depending upon variation in the amount of amplification if there is such variation in the amount of amplification in the digital signal processing section 12 (i.e., the amount of attenuation increases as the amount of amplification increases). If the amount of attenuation in the attenuator 18 is amplified by the amplifier 19, gain of the entire digital signal processing circuit shown in FIG. 1 becomes gain in the amplification processing in the digital signal processing section 12. Since this amplifier 19 is disposed in the posterior stage of the digital-to-analog converter 14, overflowing does not take place in the digital-to-analog converter 14.

For digitally ttenuating the input digital signal in the attenuator 18, there are methods including shifting down of low order bits (attenuation of −6 dB can be obtained for shift down of one bit) and multiplication with attenuation coefficient. Among these methods, the bit shift down method can be realized with the simplest structure because it can be carried out by simply discarding several low order bits.

A specific example of the embodiment of FIG. 1 is shown in FIG. 3.

In FIG. 3, the analog-to-digital converter 10 has 16 bits and the level of an analog input is adjusted in such a manner that a conversion output becomes full bits (i.e., value immediately before overflowing) with respect to an analog input of 0 dB (i.e. reference maximum level), i.e., the maximum acceptable input bbecomes 0 dB.

The attenuator 18 attenuates the input digital signal by −6 dB in correspondence to the amount of amplification (maximum +6 dB) in the digita signal processing section 12. This amount of attenuation of −6 dB corresponds to shift down of one bit and, accordingly, the attenuator 18 discards the least significant bit of the input digital signal to reduce the bit number of the signal to 15 bits and further adds a bit "0" is the most significant bit to output the signal as data of 16 bits.

The digital signal processing section 12 amplifies the input digital signal by the maximum amount of +6 dB in the digital signal processing but, since this digital signal has been attenuated by −6 dB by the attenuator 18, the digital signal is only restored to the full bits oof the maximum 16 bits so that no overflowing takes place.

The 16-bit output of the digital signal processing section 12 is converted to an analog signal by a 16-bit digital-to-analog converter 14 and delivered out after being amplified by +6 dB by an analog amplifier 19 for cancelling the amount of attenuation of the attenuator 18. By this arrangement, the gain of the entire circuit of FIG. 3 becomes the gain of the digital signal processing section 12, i.e., +6 dB. In the circuit as shown in FIG. 3 in which the input signal is attenuated by −6 dB after the analog-to-digitll converter 10, a remakable improvement is achieved in the maximum acceptable noise input, i.e, dynamic range, as compared with the prior art device in which the input signal is attenuated by −6 dB before the analog-to-digital converter 10. This is attributable to difference in efficieccy between the theoretic limit of the 16-bit digital system and the actually obtained efficiency. In the 16-bit digital system, a dynamic range of about 97 dB is theoretically obtainable but the actually obtained dynamic range is only about 85 dB due to noise produced in the analog-to-digital converter 10. The dynamic range of 85 dB is accuracy of 14 bits and this means that low order 2 bits in 16 bits of the analog-to-digital conversion output consist of noise.

If, accordingly, one bit of data after the analog-to-digital conversion is discarded as shown in FIG. 3, a head margin in the digital signal processing section 12 can be secured and overflowing can be prevented even when there is a gain of 6 dB in the digital signal processing section 12 without causing deterioration in the quality of the signal or in the signal-to-noise ratio.

In the case of the circuit of FIG. 3 in which the entire digital system is of the same bit number, the range of amount of attenuation H dB in the attenuator 18 required for preventing deterioration in the signal-to-noise ratio in the entire digital system exceeding deterioration in the signal-to-noise ratio in the analog-to-digital converter 10 is generally expressed as $$H \text{ dB} \leqq D - D_{AN}$$

where D represents theoretic limit dynamic range corresponding to the bit number of the digital system (e.g., 96 dB in the case of 16 bits) and $D_{AN}$ represents actual dynamic range which is reduced due to noise produced in the analog-to-digital conversion.

In other words, if the digital signal after the analog-to-digital conversion is attenuated within the range of $D - D_{AN}$, a head room in the digital signal processing section 12 can be secured and clipping distortion in the output signal due to overflow can be prevented without increasing noise and without substantially losing information contained in the original signal in the process of signal transmission.

Figure 4:
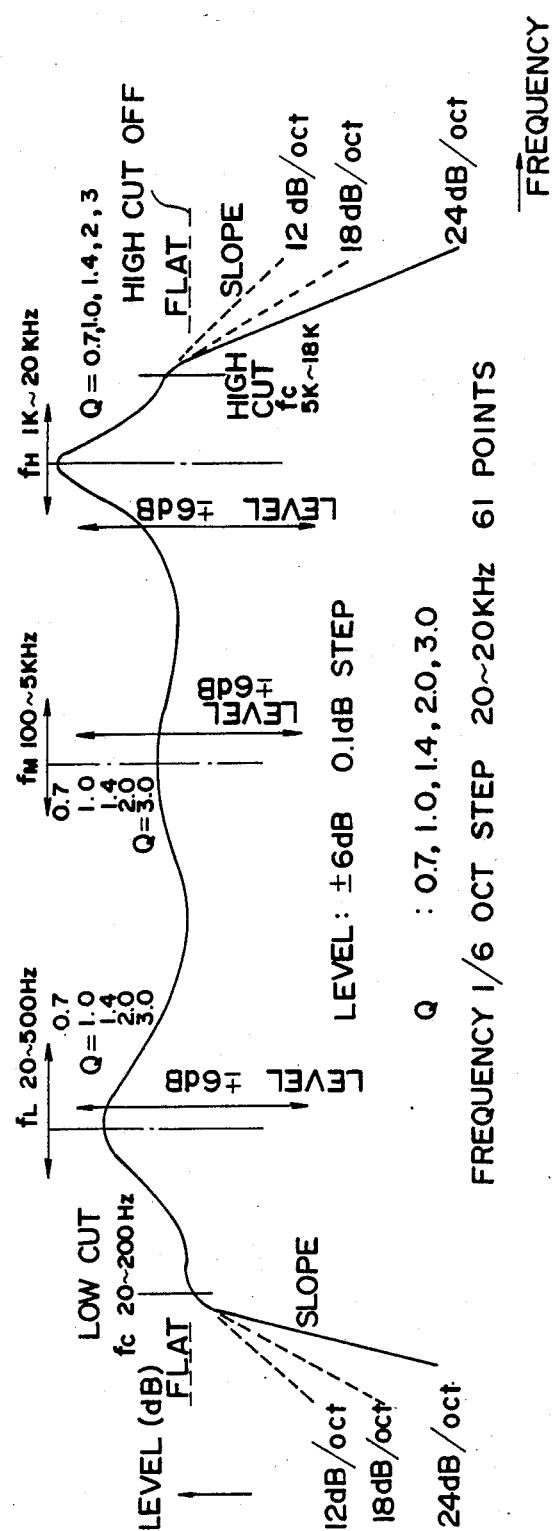
FIG. 4 is a graph showing an example of characteristics in the case of constructing the digital signal processing section 12 of FIG. 3 as a digital graphic equalizer.

By way of example of the digital signal processing section 12 of FIG. 3, a case wherein the digital graphic equalizer described in the Japanese Patent Application No. 230139/1986 is employed will now be described. This graphic equalizer is constructed as a 3-band parametric equalizer having band-pass characteristics and is capable of freely establishing center frequencies fL, fM and fH, level and Q with respect to each of low, middle and high frequency regions as shown in FIG. 4. This equalizer is also capable of establishing cut-off frequencies fc of low cut and high cut and gradient of the slope.

The center frequencies fL, fM and fH of the respective frequency regions can be established within the following ranges with 1/6 oct. step:

fL: 20 to 500 Hz
fM: 100 Hz to 5 KHz
fH: 1 KHz to 20 KHz

These center frequencies are established under the condition of fL<fM<fH.

The level of each region is established within he range of −6 dB to +6 dB with 0.1 dB step.

Q in each region is established at any one of 0.7, 1.0, 1.4, 2.0 and 3.0.

The low cut and high cut frequencies fc are established respectively within the range of 20–200 Hz and 5 KHz–18 KHz and the gradient of slope is established at any one of 12 dB/oct, 18 dB/oct and 24 dB/oct.

Figure 5:
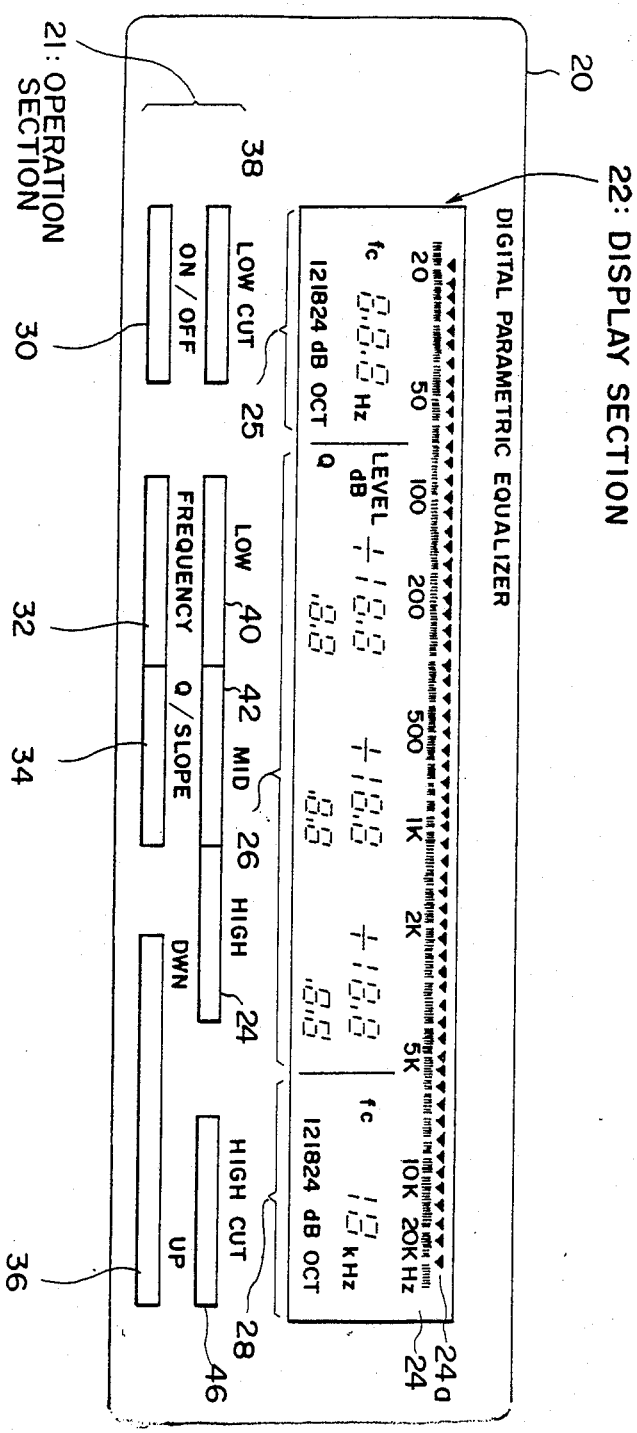
FIG. 5 is a view showing an example of a portion including a display section and an operation section of the graphic equalizer.

FIG. 5 shows in an enlarged scale a parameter setting section 20 for setting various parameters of the digital equalizer. This parameter setting section 20 has an operation section 21 in its lower portion and a display section 22 in its upper portion.

The display section 22 displays set values of the respective parameters and is constructed of LCDs with back lights. In this display section 22, the center frequencies fL, fM and fH among the parameters of the three frequency regions are represented in graphic representation on a scale and the level and Q are numerically represented. Since an enormous amount of arithmetic operation is required for completely representing entire frequency characteristics in graphic representation, it is represented in a simplified manner. Namely, it is represented in the above described manner having regard to the following considerations:

(1) Since the frequency is divided int three frequency regions, it is desirable to represent the center frequencies in the graphic representation on the scale for understanding positional relations among themselves.

(2) The level is customarily represented digitally so that it can be understood readily in this manner of representation.

(3) Q is generally hard to be understood so that it will suffice for the purpose of representing the characteristics to represent Q so that it can be recognized in any way.

By such arrangement of the display section 22, the frequency control characteristics can be represented in a simple manner so that they can be readily understood and used.

In the display section 22, the upper frequency scale 24 represent the center frequencies fL, fM and fH in the respective frequency regions. Positions of the set frequencies fL, fM and fH are displayed at three positions on marks 24a arranged in a line above the frequency scale 24.

Among the numerical representation, the low cut frequency is shown in the upper stage and its slope (either 12 dB/oct, 18 dB/oct or 24 dB/oct) in the lower stage in the left portion 25. In the central portion 26, the level is shown in the upper stage and Q in the lower stage for the low, middle and high frequency regions from the left. In the right portion 28, the high cut frequency is shown in the upper stage and its slope in the lower stage (either 12 dB/oct, 18 dB/oct or 24 dB/oct).

The operation section 21 comprises the following keys constructed of tact switches for establishing various parameters:

(1) equalizer on/off key 30

This is a key for turning on and off the function of the digital equalizer. When this key has been turned off, the characteristics of the digital equalizer become flat. When this key has been turned on (it can be turned on also by operation of other keys such as 32 and 34 associated with the digital equalizer), the respective parameters are restored to the states before the key 30 is turned off.

(2) Frequency key 32 and Q/slope key 34

These are keys for selecting an established mode. The frequency key 32 is depressed when the respective enter frequencies should be established and the Q/slope key 34 is depressed when Q or slope should be established. A level establishing mode is brought about when these keys are not depressed.

(3) Up/down key 36

This is a key for performing up/down of the respective set values. When the right side of this key is depressed, the set value is increased and when the left side of this key is depressed, the set value is decreased.

(4) Low cut key 38

This is a key for establishing the low cut characteristics. If the frequency key 32 is depressed after this key 38 is depressed and thereafter the up/down key 36 is operated, the low cut frequency is established. If the Q/slope key 34 is depressed after the low cut key 38 is depressed and thereafter the up/down key 36 is operated, the slope of the low cut is established.

The low cut key 38 is a toggle type key and turned on and off alternately at each depression. When this key is off, the slope of the low cut becomes flat, display in the display section 25 is extinguished and the operation of the p/down key 36 is not accepted any longer. When this key is turned on from the off state, the previous set values are displayed.

(5) Low key 40, mid key

These are keys used when characteristics of the three divided regions should be established. These keys correspond respectively to the low middle and high frequency regions. If the low key 40 is depressed and the up/down key 36 is operated, the level of the low frequency region is established. If the low key 40 is depressed and then the frequency key 32 is depressed and the up/down key 36 is operated, the center frequency fL of the low frequency region is established. If the low key 40 is depressed and then the Q/slope key 34 is depressed and the up/down key 6 is operated, Q of the low frequency region is established.

Similarly, with respect to the middle and high frequency regions, the respective parameters can be established by depressing the middle key 42 and high key 44 and performing the similar operations.

(6) High cut key 46

This is a key for establishing the high cut characteristics and the high cut frequency and its slope can be established by performing similar operation to the low cut key 38. When this key has been turned off, the slope of the high cut becomes flat, the operation of the up/down key 36 is not accepted any longer and the display in the display section 28 is extinguished (a set value before the key 46 is turned off is held in a memory).

Since the maximum gain is +6 dB when the digital graphic equalizer shown in FIGS. 4 and 5 is employed, overflowing in the digital equalizer can be prevented no matter how he parameters of the level of the equalizer have been set, if the attenuator 18 (FIG. 3) is set at a rate of attenuation cancelling the gain of the digital equalizer, i.e, attenuation rate of −6 dB.

In the above described embodiment, the attenuation rate is shown as a fixed rate but it may be rate which is automatically varied in accordance with value of parameter of a set level. In this case, the rate may be automatically set at a value at which gain at the highest peak is cancelled, e.g., at the attenuation rate of −5 dB if the gain is +5 dB and at the attenuation rate of −4 dB if the gain is +4 dB. In this case, however, the attenuation cannot be achieved by the bit shift down method so that the attenuation must be made by other method such as multiplying attenuation coefficient.

In the embodiment shown in FIG. 3, the entire digital system is constructed in the same bit number. The invention is applicable also to a digital system including a section having a different bit number from other sections in the system.

For example, this invention is applicable to a digital signal processing circuit in which the analog-to-digital converter 10 in FIG. 1 is constructed of 16 bits, the digital signal processing section 12 is constructed of an input section of 16 bits and signal processing section and output section of 18 bits each for preparing a head margin in itself, and the digital-to-analog converter 14 is constructed of 18 bits. Since, in this case, the digital signal processing section 12 has a head margin in itself, the attenuation rate in the attenuator 18 can be established at a value which is smaller than an attenuation rate corresponding to gain in the digital signal processing section 12. It is essential in any case that the attenuation should be made to a value at which overflowing will not take place in the digital signal processing means.

In the above described embodiment, the amplifier 19 for cancelling the amount of attenuation in the attenuator 18 is provided independently in a posterior stage of the digital-to-analog converter 14. This amplifier 19 however may be contructed as a part of a component having a gain if such component is connected at a posterior stage.

What is claimed is:

1. A digital signal processing circuit comprising:
   analog-to-digital conversion means for converting an input analog signal to a digital signal;
   digital signal processing means for subjecting an output digital signal of said analog-to-digital conversion means to a digital signal processing including at least a processing for digitally amplifying the signal by an amount independent of the amplitude of the input analog signal;
   digital-to-analog conversion means for converting an output signal of said digital signal processing means to an analog signal; and
   digital signal attenuation means provided on the input side of said digital signal processing means for attenuating the digital signal provided by said analog-to-digital conversion means to a value which is below a value at which said digital signal processing means overflows.

2. A digital signal processing circuit as defined in claim 1 wherein the bit number of the digital signal provided by said analog-to-digital conversion means is equal to the bit number used for processing a signal in said digital signal processing means and an amount of attenuation of said digital signal attenuation means is equal to an amount of amplification of said digital signal processing means.

3. A digital signal processing circuit as defined in claim 1 which further comprises analog amplifying means for amplifying, in analog, the output of said digital-to-analog conversion means with an amount of amplification corresponding to an amount of attenuation of said digital signal attenuation means.

4. A digital signal processing circuit as defined in claim 1 wherein said digital signal attenuation means attenuates the digital signal by bit shifting.

* * * * *